United States Patent
Ohno et al.

(10) Patent No.: US 9,466,517 B2
(45) Date of Patent: Oct. 11, 2016

(54) MICROWAVE ANNEALING APPARATUS AND METHOD OF MANUFACTURING A SEMICONDUCTOR DEVICE

(71) Applicant: KABUSHIKI KAISHA TOSHIBA, Minato-ku, Tokyo (JP)

(72) Inventors: Hiroshi Ohno, Yokohama (JP); Tomonori Aoyama, Yokohama (JP); Kiyotaka Miyano, Tokyo (JP); Yoshinori Honguh, Yokohama (JP); Masataka Shiratsuchi, Kawasaki (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 502 days.

(21) Appl. No.: 13/859,153

(22) Filed: Apr. 9, 2013

(65) Prior Publication Data

US 2014/0073065 A1   Mar. 13, 2014

(30) Foreign Application Priority Data

Sep. 12, 2012   (JP) .................................. 2012-200499

(51) Int. Cl.
*H05B 6/64* (2006.01)
*H05B 6/74* (2006.01)
(Continued)

(52) U.S. Cl.
CPC ... *H01L 21/67115* (2013.01); *H01L 21/67248* (2013.01); *H05B 6/6455* (2013.01); *H05B 6/68* (2013.01); *H05B 6/806* (2013.01); *H01L 21/324* (2013.01)

(58) Field of Classification Search
CPC .................. H01L 21/67248; H01L 21/67115; H01L 21/324; H05B 6/806; H05B 6/6455; H05B 6/68

USPC ........ 219/678, 697, 700, 702, 710, 716, 750, 219/751, 759, 746, 748, 757; 438/5, 478; 118/730
See application file for complete search history.

(56) References Cited

U.S. PATENT DOCUMENTS 4,477,707 A * 10/1984 Kim .............................. 219/697
5,119,540 A *  6/1992 Kong et al. ................... 118/730
(Continued)

FOREIGN PATENT DOCUMENTS

JP      9-106900 H     4/1997
JP      2002-198322 A  7/2002
(Continued)

OTHER PUBLICATIONS

Lojek, B., et al.; "Investigation of Microwave Annealed Implanted Layers with TWIN Metrology System"; Advanced Thermal Processing of Semiconductors, 2008, RTP 2008, 16th IEEE International Conference, pp. 273-279.
(Continued)

*Primary Examiner* — Quang Van
(74) *Attorney, Agent, or Firm* — Ohlandt, Greeley, Ruggiero & Perle, L.L.P.

(57) ABSTRACT

According to one embodiment, a microwave annealing apparatus is provided, including a housing shielding electromagnetic waves, a first electromagnetic wave source configured to apply a first electromagnetic wave into the housing, a second electromagnetic wave source configured to apply, into the housing, a second electromagnetic wave having a higher frequency than the first electromagnetic wave, a susceptor configured to hold a semiconductor substrate, made of a material transparent to the first electromagnetic wave and provided in the housing, a temperature measuring device configured to measure the temperature of the semiconductor substrate, and a control unit configured to control the power of each of the first and second electromagnetic wave sources in accordance with the temperature measured by the temperature measuring device.

9 Claims, 5 Drawing Sheets

(51) Int. Cl.
*H01L 21/67* (2006.01)
*H05B 6/68* (2006.01)
*H05B 6/80* (2006.01)
*H01L 21/324* (2006.01)

(56) References Cited

U.S. PATENT DOCUMENTS

| | | | |
|---|---|---|---|
| 6,838,649 B2 * | 1/2005 | Lee | 219/757 |
| 7,589,028 B1 | 9/2009 | Cho et al. | |
| 7,928,021 B2 | 4/2011 | Kowalski et al. | |
| 2006/0289526 A1 * | 12/2006 | Takizaki | H05B 6/6402 219/746 |
| 2007/0224839 A1 | 9/2007 | Shimizu | |
| 2009/0184399 A1 | 7/2009 | Kowalski et al. | |
| 2010/0055881 A1 * | 3/2010 | Shimizu | 438/478 |
| 2011/0076842 A1 | 3/2011 | Yoshino et al. | |
| 2013/0062341 A1 * | 3/2013 | Ashida | 219/715 |

FOREIGN PATENT DOCUMENTS

| | | |
|---|---|---|
| JP | 2003-7686 A | 1/2003 |
| JP | 2007-258286 A | 10/2007 |
| JP | 2011-77065 A | 4/2011 |
| JP | 2011-77408 A | 4/2011 |
| JP | 2013-74072 A | 4/2013 |
| KR | 2012-0096892 A | 8/2012 |
| KR | 10-2014-0030567 A | 3/2014 |

OTHER PUBLICATIONS

Ohno, Hiroshi, et al.; "Optical Interference Effect on Chip's Temperature Distribution in the Optical Annealing Process"; Advanced Thermal Processing of Semiconductors, 2008, RTP 2008, 16th IEEE International Conference; pp. 103-106.
Korean Office Action (with English translation) dated Aug. 11, 2014 from corresponding Korean Application No. 10-2013-36679, 11 pages.
Japanese Office Action (with English translation) dated Jul. 15, 2014 from corresponding Japanese Application No. 2012-200499, 10 pages.
Korean Office Action (with English translation) dated Feb. 17, 2014 from corresponding Korean Application No. 10-2013-36679, 9 pages.

* cited by examiner

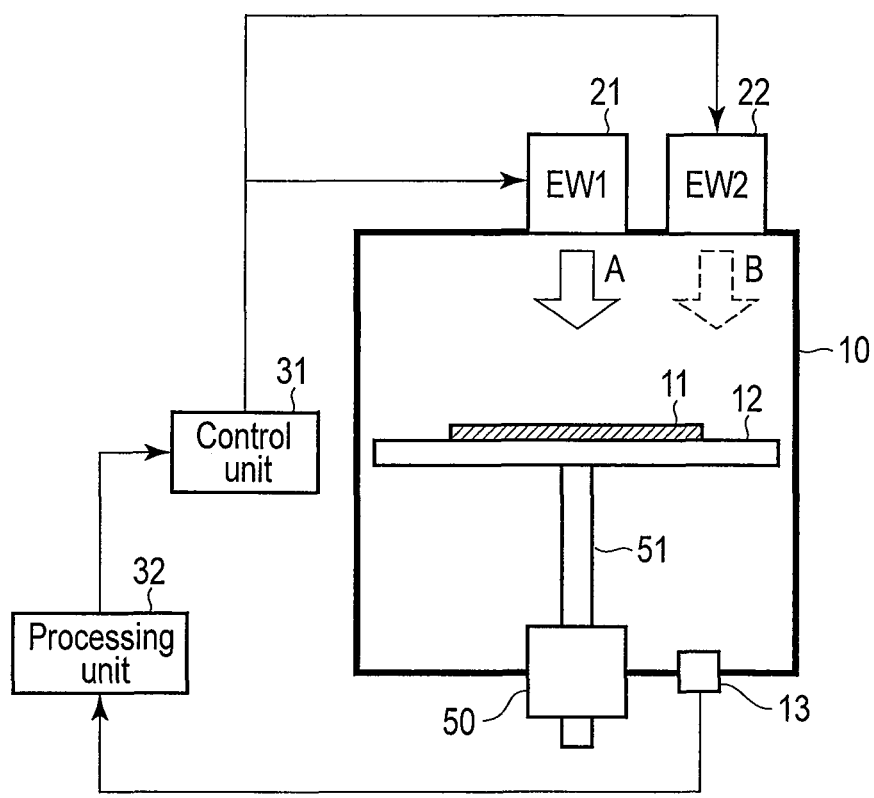
F I G. 5

US 9,466,517 B2

MICROWAVE ANNEALING APPARATUS AND METHOD OF MANUFACTURING A SEMICONDUCTOR DEVICE

CROSS-REFERENCE TO RELATED APPLICATIONS

This application is based upon and claims the benefit of priority from Japanese Patent Application No. 2012-200499, filed Sep. 12, 2012, the entire contents of which are incorporated herein by reference.

FIELD

Embodiments described herein relate generally to a microwave annealing apparatus for use in manufacturing a three-dimensional semiconductor device, and a method of manufacturing a semiconductor device, by using the apparatus.

BACKGROUND

In recent years, attention is paid to microwave annealing as a method of activating the circuits in semiconductor devices. Microwave annealing can achieve activation at lower temperatures (350 to 650° C.) than optical annealing. It can therefore control the diffusion of impurities, thereby to lower the leakage current. Further, a microwave reaches the deepest layer of a multi-layered circuit because its wavelength (several centimeters to hundreds of centimeters) is longer than the wavelength of light. It may therefore achieve uniform activation of any multi-layered circuit with a high probability. Hence, the microwave annealing process is anticipated to be of use in manufacturing three-dimensional semiconductor devices.

However, microwave annealing rarely achieves activation if the microwave has a frequency of 1 GHz or less. In this case, it takes longer to accomplish sufficient activation, as proven by experiments. On the other hand, if the frequency of the electromagnetic wave is raised to a light-frequency region, for example 300 THz or more (equivalent to a wavelength of 1 μm or less), low-temperature activation will not occur. Unless the temperature is set to 1000° C. or more, activation will not be accomplished in fact. In this case, the impurities will inevitably diffuse, possibly imposing adverse influence.

In order to solve this problem, the frequency of the microwave may be tuned to an optimal value. It is, however, very difficult to perform optimal tuning owing to variation in the type of semiconductor substrate, and amount of non-single-crystal silicon, as well as other factors. As a result, it is extremely difficult to tune the microwave frequency for the respective semiconductor substrates.

BRIEF DESCRIPTION OF THE DRAWINGS

FIG. 5 is a schematic configuration diagram showing a microwave annealing apparatus according to a fourth embodiment;

DETAILED DESCRIPTION

In general, according to one embodiment, a microwave annealing apparatus comprises: a housing configured to shield electromagnetic waves; a first electromagnetic wave source configured to apply a first electromagnetic wave into the housing; a second electromagnetic wave source configured to apply, into the housing, a second electromagnetic wave having a higher frequency than the first electromagnetic wave; a susceptor configured to hold a semiconductor substrate, made of a material transparent to the first electromagnetic wave and provided in the housing; a temperature measuring device configured to measure the temperature of the semiconductor substrate; and a control unit configured to control the power of each of the first and second electromagnetic wave sources in accordance with the temperature measured by the temperature measuring device.

Before describing the embodiment, the low-temperature activation by means of microwave annealing and a method of increasing the efficiency of low-temperature activation will be explained.

First, the low-temperature activation mechanism of the microwave annealing will be explained. However, the low-temperature activation mechanism of the microwave annealing has not been explicated yet. Therefore, a theoretical model of the low-temperature activation mechanism, which is based on actual measurements, will be described here.

As is generally known, single-crystal silicon, which is the material used for semiconductor substrates, scarcely absorbs microwaves. Non-single-crystal silicon is considered to play an important role in the microwave annealing. In fact, our measurements show that non-single-crystal silicon has a very large induction loss (i.e., imaginary part of the complex dielectric constant) with respect to microwaves.

Figure 6:
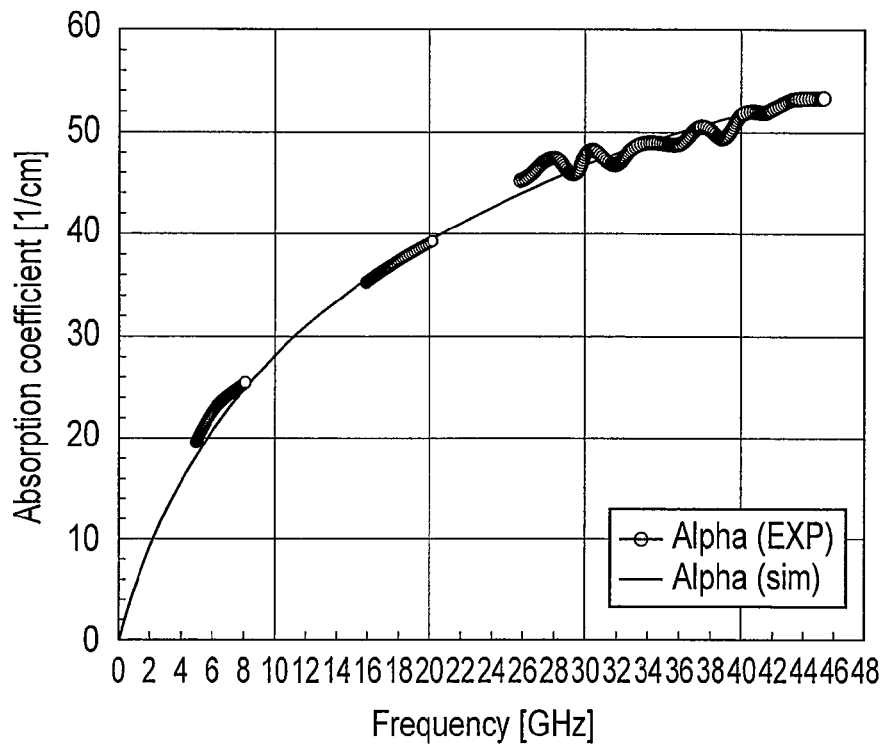
FIG. 6 is a characteristic diagram showing the relation of the microwave frequency and the absorption coefficient, which is observed when microwave annealing is performed.

FIG. 6 shows the relation of the microwave frequency and the absorption coefficient, which is observed when microwave annealing is performed on a semiconductor substrate (i.e., silicon substrate on which various circuits are provided and which has a single-crystal silicon part). In FIG. 6, the frequency spectrum of the absorption coefficient, calculated from the measuring results, is indicated by circles (void signs). In FIG. 6, the frequency [GHz] is plotted on the horizontal axis, and the absorption coefficient [1/cm] is plotted on the vertical axis.

As seen from FIG. 6, the lower the frequency, the smaller the absorption coefficient will become. That is, as the frequency decreases, the microwave is absorbed less, and activation can be said to be hardly induced by the annealing. By contrast, the higher the frequency, the larger the absorption coefficient will become. Nonetheless, as the frequency approaches the phonon vibration (at 3 to 17 THz) of single-crystal silicon and non-single-crystal silicon, the energy absorbed may more likely change to heat. In this case, the low-temperature activation mechanism is considered to function less than at lower frequencies.

From the measuring results mentioned above, in the low-temperature activation mechanism, a dipole moment seems to be generated from the dangling bond of non-single-crystal silicon, and any "molecule" having the dipole moment rotates, resulting in crystal growth. The word "molecule" used here also means a group of atoms (a group may consist of only one atom, nonetheless).

On the other hand, the energy of the microwave adsorbed into the non-single-crystal silicon must have a non-thermal component that is used directly to grow the crystal, not through heat, in addition to the thermal component that will change to heat. In the theoretical model of the low-temperature activation mechanism, the non-thermal crystallization can be realized if molecules spin, resonating with the vibration of the microwave electric field. Hence, non-thermal components are considered to realize the activation at low temperatures.

Any thermal component is readily excited by a microwave having a frequency close to the resonance frequency of phonon vibration. The phonon frequency of non-single-crystal silicon ranges from 3 THz to 17 THz. By contrast, the frequency for exciting the non-thermal components can achieve low-temperature activation, in the range of at least 2 to 6 GHz, as probed by experimental facts. Thus, this frequency is considered to be in a lower frequency band than the frequency for exciting the thermal component.

A method of increasing the efficiency of low-temperature activation will be explained below.

As stated above, non-single-crystal silicon is considered to cause non-thermal crystallization by virtue of the molecule spinning. The spinning of molecules is moderated by heat and friction. In view of this, the complex dielectric constant $\varepsilon$ can be described as follows, as known in the art, in the form of a response function by virtue of the dielectric relaxation of the device.

$$\varepsilon \cong \varepsilon_\infty + \frac{\varepsilon_S - \varepsilon_\infty}{1 + 2\pi i f \tau_D} \quad (1)$$

where $\varepsilon_\infty$ is the limit value for the infinite complex dielectric constant, $\varepsilon_S$ is the limit value for the complex dielectric constant at a frequency close to 0, f is the frequency of electromagnetic wave, i is an imaginary number, and $\tau_D$ is the dielectric relaxation time. The dielectric relaxation time is given as:

$$\tau_D = \frac{\zeta}{2k_B T} \quad (2)$$

where $\zeta$ is the friction coefficient, $k_B$ is Boltzmann's constant, and T is the temperature in the medium (here, non-single-crystal silicon).

Applying the complex dielectric constant $\varepsilon$ and the light velocity c, the absorption coefficient can be expressed as follows:

$$\alpha = \frac{4\pi \mathrm{Im}(\sqrt{\varepsilon})}{c} f \quad (3)$$

where Im( ) is the imaginary number part. If the equation (1) is substituted in this equation (3), the absorption coefficient will be obtained. The equation (3) agrees well with the measuring results shown in FIG. 6. In FIG. 6, the frequency dependency of the complex dielectric constant, theoretically calculated, is shown as a solid line, along with the frequency dependency actually measured.

Figure 7:
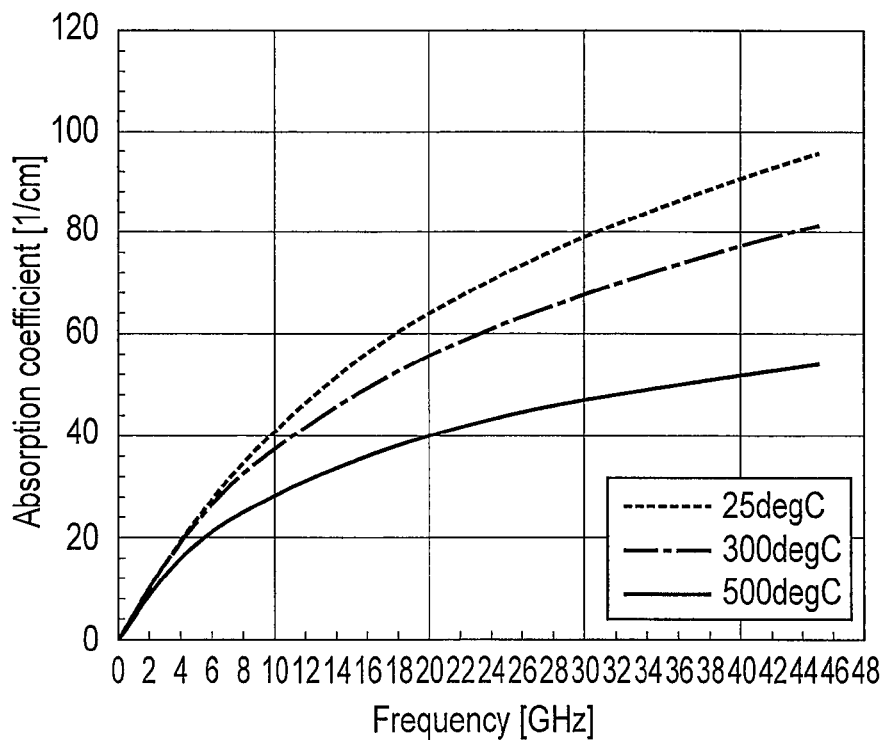
FIG. 7 is a characteristic diagram showing the relation of the microwave frequency and the absorption coefficient observed when microwave annealing is performed at a different temperature.

If the equation (3) is used, the frequency dependency of the complex dielectric constant can be predicted. The complex dielectric constant calculated is plotted in FIG. 7, each for several different temperatures T. In FIG. 7, the solid line shows the case where the temperature is 25° C., the dot-chain line shows the case where the temperature is 300° C., and the broken line shows the case where the temperature is 500° C. As seen from FIG. 7, the higher the temperature, the higher the absorption coefficient will be. From this it can be said that the temperature of the substrate may first be so lowered to control the impurity diffusion and then microwave annealing may be performed. Sufficient activation can thereby be achieved, even with low-frequency microwaves.

Thus, the temperature of the substrate is lowered, controlling the impurity diffusion, and microwave annealing is then performed, increasing the efficiency of activation. As a result, the activation can be promoted, and the annealing time can be shortened. The use of low frequency microwaves (e.g., 1 GHz or less) cannot effectively raise the temperature of the substrate. This is because the microwaves are scarcely absorbed at low temperatures if the substrate contains non-single-crystal silicon in a very small amount, and the temperature of the substrate will hardly rise.

As an electromagnetic wave for achieving such temperature assist as described above, a microwave having a frequency of 45 GHz or more may be used, for two reasons. First, the absorption coefficient actually measured is maximal at 45 GHz, as seen from FIG. 6 and FIG. 7. Second, the absorption coefficient increases, in theory, at frequencies of 45 GHz or more.

In order to raise the temperature of the substrate, a terahertz wave having a large absorption coefficient may be applied to non-single-crystal silicon. In this case, the terahertz wave may have a frequency ranging from 3 THz to 17 THz, which is the phonon frequency. Alternatively, light may be used. In this case, not only non-single-crystal silicon, but also the single-crystal silicon, i.e., material of the semiconductor substrate, absorbs light. The substrate can therefore be sufficiently heated even if the semiconductor substrate contains non-single-crystal silicon in a very small amount. If this is the case, the frequency may be set to 300 THz or more, at which the absorption coefficient is large with respect to single-crystal silicon and non-single-crystal silicon.

A heater may be arranged above the susceptor holding the substrate. In this case, the shape of the housing must be adjusted because the heater disturbs the electromagnetic field distribution defined by the microwave in the housing. Further, since the heater absorbs the microwave, the temperature of the substrate being annealed must be controlled to a constant value, while keep monitoring the temperature of the substrate. In view of this, the temperature assist with electromagnetic wave is more desirable than the temperature assist by means of the heater.

Embodiments will be described with reference to the accompanying drawings.

(First Embodiment)

Figure 1:
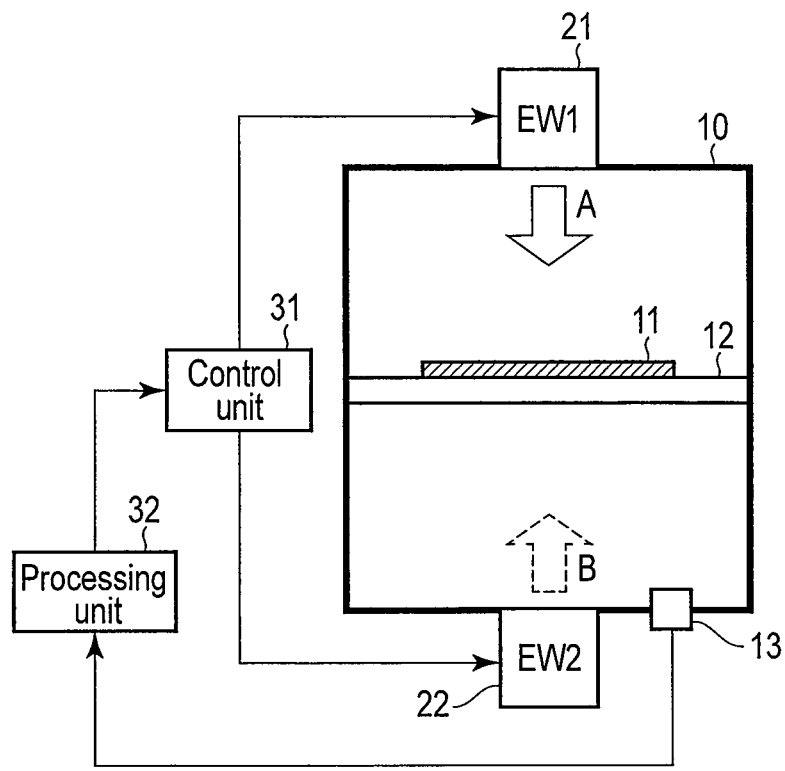
FIG. 1 is a schematic configuration diagram showing a microwave annealing apparatus according to a first embodiment.

FIG. 1 is a schematic configuration diagram that shows a microwave annealing apparatus according to the first embodiment.

The microwave annealing apparatus according to this embodiment comprises a housing 10 configured to shield and confine electromagnetic waves, first and second electromagnetic wave sources 21 and 22 configured to introduce electromagnetic waves into the housing 10, and a susceptor 12 provided in the housing 10 and configured to hold a semiconductor substrate 11. Further, the microwave annealing apparatus comprises a temperature sensor 13 configured to measure the temperature of the substrate 11, a control unit 31 configured to control the electromagnetic wave sources 21 and 22, and a processing unit 32 configured to drive the control unit 31.

The first electromagnetic wave source 21 (EW1) is provided on the upper surface of the housing 10. The first electromagnetic wave source 21 applies an electromagnetic wave A in the microwave region to the upper surface of the semiconductor substrate 1. The second electromagnetic wave source 22 (EW2) is provided on the lower surface of the housing 10. The second electromagnetic wave source 22 applies an electromagnetic wave B having a higher frequency than the electromagnetic wave A, to the lower surface of the semiconductor substrate 1. The microwaves are reflected in the housing 10. Thus, not only the electromagnetic waves A and B, but also the waves reflected in the housing 10 are applied to the semiconductor substrate 11.

As the first electromagnetic wave source 21, a microwave generating device having, for example, a magnetron, may be used. In this case, the electromagnetic wave A is a microwave, and its frequency is, for example, 6 GHz. The frequency of the electromagnetic wave A is not limited to this value, nonetheless. It may be any value ranging from 1 GHz to 45 GHz.

As the second electromagnetic wave source 22, a microwave generating device having, for example, a gyrotron, may be used. The frequency of the electromagnetic wave B is, for example, 45 GHz. The frequency is not limited to this value, nonetheless. It may be higher than that of the electromagnetic wave A and can be of any value that can efficiently heat the semiconductor substrate 11. For example, it may be a terahertz wave, and its frequency may range from, for example, 3 THz to 17 THz.

The installation positions of the electromagnetic wave sources 21 and 22 are not limited to the upper and lower positions, respectively. Rather, electromagnetic wave sources 21 and 22 may be positioned the other way around. Moreover, both electromagnetic wave sources 21 and 22 may be positioned either at the upper position or lower position.

The housing 10 is made of a material such as stainless steel, which reflects the electromagnetic wave A and electromagnetic wave B. The material is not limited to stainless steel, nevertheless. It may be aluminum or copper.

The temperature sensor 13 is, for example, a radiation thermometer, and is arranged on the inner bottom of the housing 10. The temperature sensor 13 is directed to the semiconductor substrate 11 to measure, in a non-contact manner, the temperature of the semiconductor substrate 11. The temperature sensor 13 may be provided not on the inner bottom of the housing 10, but on the ceiling of the housing 10.

The susceptor 12 is preferably transparent to the electromagnetic wave A so that it may not adversely affect the propagation of the electromagnetic wave A. The susceptor 12 may be either transparent or not transparent to the electromagnetic wave B. Therefore, single-crystal silicon, for example, can be used as the material of the susceptor 12. The material is not limited to single-crystal silicon, nonetheless. It may be glass. Either material is transparent to the electromagnetic wave A.

The control unit 31 is connected to both electromagnetic wave sources 21 and 22. The control unit 31 can adjust the intensities at which the electromagnetic waves A and B are applied from the electromagnetic wave sources 21 and 22, independently of each other. Further, the control unit 31 can turn on and off the first electromagnetic wave source 21 and the second electromagnetic wave source 22, independently of each other.

The processing unit 32 is connected to the temperature sensor 13 and control unit 31. The processing unit 32 reads, in real time, the value the temperature sensor 13 has measured, and supplies the value to the control unit 31. The control unit 31 can therefore adjust, in real time, the intensities of the electromagnetic waves A and B.

Basically, the semiconductor substrate 11 is made of single-crystal silicon. However, various circuit layers are formed on the single-crystal silicon substrate. The semiconductor substrate 11 therefore has regions made of non-single-crystal silicon. The regions that should be activated by annealing, in particular, are doped with impurities, becoming non-single crystal (amorphous).

An annealing method performed by using the apparatus according to this embodiment will be explained with reference to the flowchart of FIG. 2.

First, the processing unit 32 turns on the electromagnetic wave source 22 through the control unit 31. The electromagnetic wave source 22 therefore applies an electromagnetic wave B to the semiconductor substrate 11 (Step S1). Applied with the electromagnetic wave B, the semiconductor substrate 11 is efficiently heated, and the substrate temperature rises. While the electromagnetic wave B is being applied, the processing unit 32 reads the temperature the temperature sensor 13 has measured, thus measuring the temperature T of the semiconductor substrate 11 in real time (Step S2). Then, the processing unit 32 determines whether the temperature T of the semiconductor substrate 11 has reached a preset temperature Tref (e.g., 500° C.) (Step S3). If the temperature T of the semiconductor substrate 11 is found to have reached the preset temperature Tref, the electromagnetic wave source 22 is turned off, stopping the application of the electromagnetic wave B (Step S4). It should be noted here that the preset temperature Tref for the semiconductor substrate 11 is not limited to 500° C. The preset temperature Tref may range from 350° C. to 650° C.

Thereafter, the first electromagnetic wave source 21 is turned on, applying the electromagnetic wave A (Step S5). The electromagnetic wave A applied raises the temperature of the semiconductor substrate 11, but only by an extremely small amount. The rise of the substrate temperature, resulting from the application of the electromagnetic wave A, may become a problem. In this case, the processing unit 32 reads the temperature from the temperature sensor 13 even while the electromagnetic wave A is being applied. Then, the temperature may be controlled to become constant at, for example, 500° C. As a mechanism for maintaining the temperature at a constant value, the housing 10 may be filled with nitrogen, and the nitrogen may be circulated.

Since such a process as described above is performed on the semiconductor substrate 11, the absorption coefficient can be increased with respect to the electromagnetic wave A. In fact, the absorption coefficient becomes 1.2 times greater than at normal temperature (25° C.) after applying the electromagnetic wave B (at 500), in comparison with the case where the process is performed without applying the electromagnetic wave B.

If the electromagnetic wave B is not applied, the temperature must be raised to 500° C., only with the electromagnetic wave A. Calculated from the absorption coefficient ratio, the time required to raise the temperature to 500° C. can be reduced by a factor of 2.6 at most by also applying the electromagnetic wave B.

Assume that only the electromagnetic wave B is applied, not applying the electromagnetic wave A at all. Then, almost all the energy absorbed by the non-single crystal changes to heat, because the frequency of the electromagnetic wave B is close to the phonon frequency of non-single-crystal silicon. Such heat promotes the diffusion of impurities, resulting in the performance degradation of the circuits. Nonetheless, the use of the electromagnetic wave A, which is longer than the electromagnetic wave B, can accomplish annealing by means of low-temperature activation.

Moreover, the susceptor 12 may be made of glass. In this case, the back of the semiconductor substrate 11 can be heated, directly with the electromagnetic wave B, because glass is transparent to the electromagnetic wave B. Since the electromagnetic wave B is shorter than the electromagnetic wave A, it may be absorbed not uniformly due to the circuit patterns. In this configuration, however, no circuits are provided on the back of the semiconductor substrate 11, and non-uniform absorption will not occur.

If the susceptor 12 is made of single-crystal silicon, it can be uniformly heated with the electromagnetic wave B. Since the susceptor 12 is thermally connected to the semiconductor substrate 11, the semiconductor substrate 11 is heated. In this case, too, non-uniform absorption does not occur due to the circuit patterns.

Thus, two electromagnetic wave sources 21 and 22 are provided on the housing 10 incorporating the semiconductor substrate 11, and the second electromagnetic wave source 22 having a high frequency is driven, heating the semiconductor substrate 11 to a specific temperature. Thereafter, the first electromagnetic wave source 21 having a low frequency is driven, applying a microwave to the semiconductor substrate 11. An annealing process can thereby be performed on the semiconductor substrate 11. In this case, the efficiency at which the microwave annealing achieves the low-temperature activation can be enhanced, without tuning the apparatus in accordance with the type of the semiconductor substrate 11.

In this embodiment, the second electromagnetic wave source 22 is used as the mechanism for heating the semiconductor substrate 11, and the susceptor 12 holding the semiconductor substrate 11 is made of a material transparent to the electromagnetic wave A. The embodiment is therefore advantageous in that the electromagnetic wave A can be uniformly applied to the semiconductor substrate 11, without being disturbed by the susceptor 12 or the heating mechanism.

(Second Embodiment)

Figure 3:
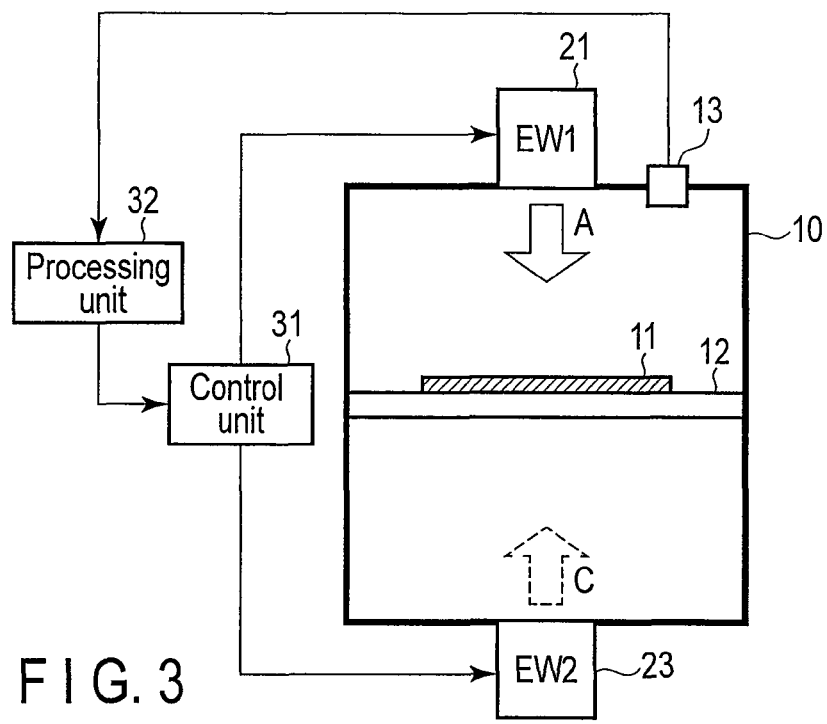
FIG. 3 is a schematic configuration diagram showing a microwave annealing apparatus according to a second embodiment.

FIG. 3 is a schematic configuration diagram showing a microwave annealing apparatus according to a second embodiment. The components identical to those shown in FIG. 1 are designated by the same reference numbers and will not be described in detail.

This embodiment differs from the first embodiment described above, in that a second electromagnetic wave source 23 used is a device configured to generate an infrared beam, or electromagnetic wave C that has a higher frequency than the electromagnetic wave A. The electromagnetic wave source 23 is, for example, halogen lamp. The peak wavelength of the electromagnetic wave C is, for example, about 1 μm. The peak wavelength of the electromagnetic wave C is not limited to this. It may be shorter than the peak wavelength of the electromagnetic wave A.

The susceptor 12 only needs to be transparent to the electromagnetic wave A, and can therefore be made of, for example, glass. This is because glass is transparent to the electromagnetic wave C, as well. The electromagnetic wave C can therefore directly heat the semiconductor substrate 11. Since no circuits are provided on the back of the semiconductor substrate 11, non-uniform absorption will not occur due to circuit patterns.

Figure 2:
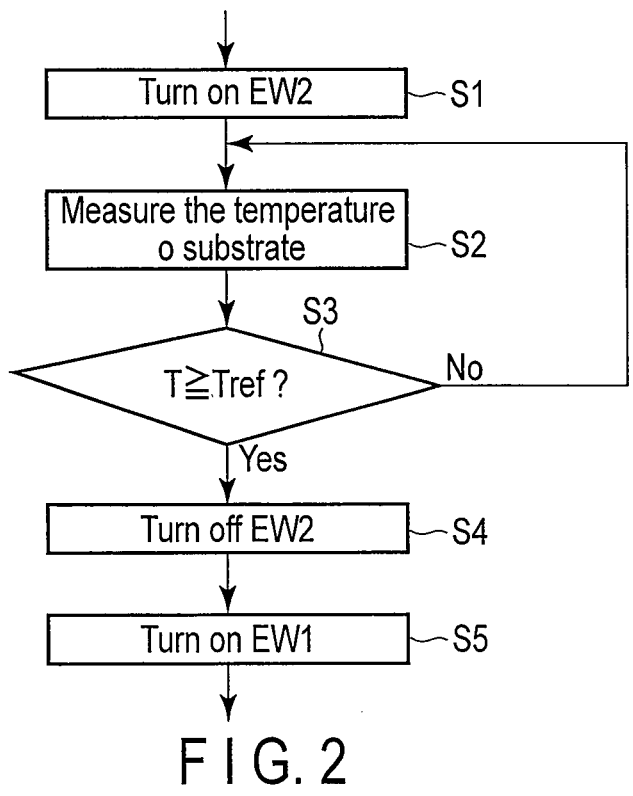
FIG. 2 is a flowchart for explaining an annealing method using the apparatus of FIG. 1.

In this configuration, the process shown in FIG. 2 may be performed, thereby to increase the absorption coefficient more with respect to the electromagnetic wave A, than in the case where the electromagnetic wave C is not applied in the process. This can raise the annealing efficiency.

Thus, in this embodiment, the first electromagnetic wave source 21 is driven, applying a microwave to the semiconductor substrate 11, after the electromagnetic wave source 23 has been driven, heating the semiconductor substrate 11 to a specific temperature. An annealing process can therefore be performed on the semiconductor substrate 11. As a result, this embodiment can achieve the same advantage as the first embodiment. Moreover, the apparatus cost can be reduced because a halogen lamp or the like can be used as second electromagnetic wave source 23.

(Third Embodiment)

Figure 4:
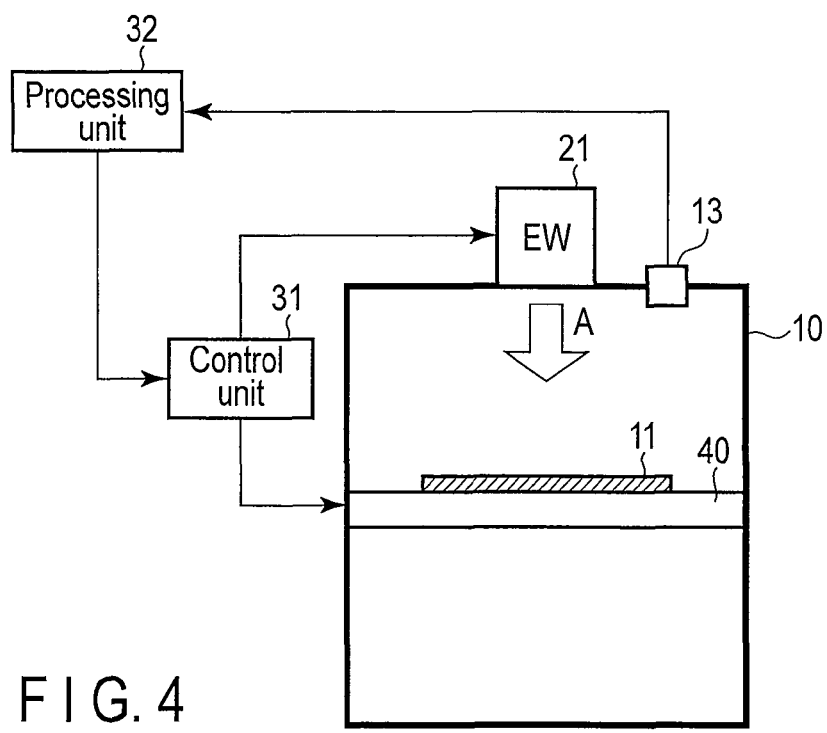
FIG. 4 is a schematic configuration diagram showing a microwave annealing apparatus according to a third embodiment.

FIG. 4 is a schematic configuration diagram showing a microwave annealing apparatus according to a third embodiment. The components identical to those shown in FIG. 1 are designated by the same reference numbers and will not be described in detail.

This embodiment differs from the first embodiment described above, in that a susceptor 40 having a heater function is utilized in place of the second electromagnetic wave source.

That is, the second electromagnetic wave source 22 shown in FIG. 1 does not exist, nor does the susceptor 12 exist. Instead, the susceptor 40 for holding the semiconductor substrate 11 is provided in the housing 10. The susceptor 40 is shaped like a plate, for holding the semiconductor substrate 11, and can be heated by a heater. It is further desired that the susceptor 40 should be transparent to the electromagnetic wave A. For example, conductive films may be vapor-deposited on both major surfaces of a quartz substrate, so thin that the electromagnetic wave A may sufficiently pass (that is, thinner than the wavelength of the electromagnetic wave A), and a transparent glass heater or a single-crystal silicon heater may be utilized. Alternatively, a transparent ceramic heater having a transparent ceramic substrate with thin conductive films vapor-deposited on both major surfaces may be used. The heater part of the susceptor 40 is connected to the control unit 31.

In this configuration, the heater of the susceptor 40 heats the semiconductor substrate 11 to 500° C. before the electromagnetic wave source 21 applies the electromagnetic wave A. Thereafter, the heater is turned off, and the electromagnetic wave source 21 is turned on, whereby microwave annealing is performed.

The process is performed on the semiconductor substrate 11 as described above. The absorption coefficient can therefore be further increased with respect to the electromagnetic wave A than in the case where no pre-heating is performed by using the heater. The annealing efficiency can thereby be enhanced.

As a result, this embodiment can achieve the same advantage as the first embodiment. Further, this embodiment is advantageous in that the electromagnetic wave A can be prevented from being disturbed at the susceptor 40, because a transparent glass heater, a single-crystal silicon heater or a transparent ceramic heater is utilized.

(Fourth Embodiment)

FIG. 5 is a schematic configuration diagram showing a microwave annealing apparatus according to a fourth embodiment. The components identical to those shown in FIG. 1 are designated by the same reference numbers and will not be described in detail.

This embodiment differs from the first embodiment described above, in that the susceptor 12 can be rotated. That is, the susceptor 12 is arranged to rotate, and is connected to a motor 50 by a shaft 51 that is transparent to the electromagnetic wave A. When driven by the motor 50, the susceptor 12 rotates. The second electromagnetic wave source 22 is provided on the upper surface of the housing 10, not on the lower surface thereof, together with the first electromagnetic wave source 21.

In this embodiment so configured as described above, the electromagnetic wave source 22 is turned on, applying the electromagnetic wave B and heating the substrate 11 to a preset temperature, and the electromagnetic wave source 22 is then turned off and the electromagnetic wave source 21 is turned on, applying the electromagnetic wave A, thereby achieving the same advantage as the first embodiment.

Further, the susceptor 12 is rotated, thereby applying the electromagnetic wave A to the semiconductor substrate 11, more uniformly than otherwise. More uniform annealing can therefore be performed.

(Modified Embodiment)

This invention is not limited to the embodiments described above.

The first electromagnetic wave source is not limited to a magnetron. Instead, it may be any source that generates a microwave of a relatively low frequency (1 to 45 GHz). The second electromagnetic wave source may be any source that generates a microwave of a higher frequency than that of the microwave generated by the first electromagnetic wave source. As the second electromagnetic wave source, a magnetron can of course be used, and a gyrotron or an infrared lamp can also be used.

The positions of the first and second electromagnetic wave sources are not limited to those in the embodiments. They can be positioned anywhere, as long as they can efficiently apply electromagnetic waves into the housing. The position of the temperature sensor is not limited to an upper or lower part of the housing. The temperature sensor only needs be positioned to measure the temperature of the semiconductor substrate at high efficiency.

The material of the susceptor is not limited to single-crystal silicon or glass. The susceptor can be made of any material that is transparent to the electromagnetic wave A.

Figure 8:
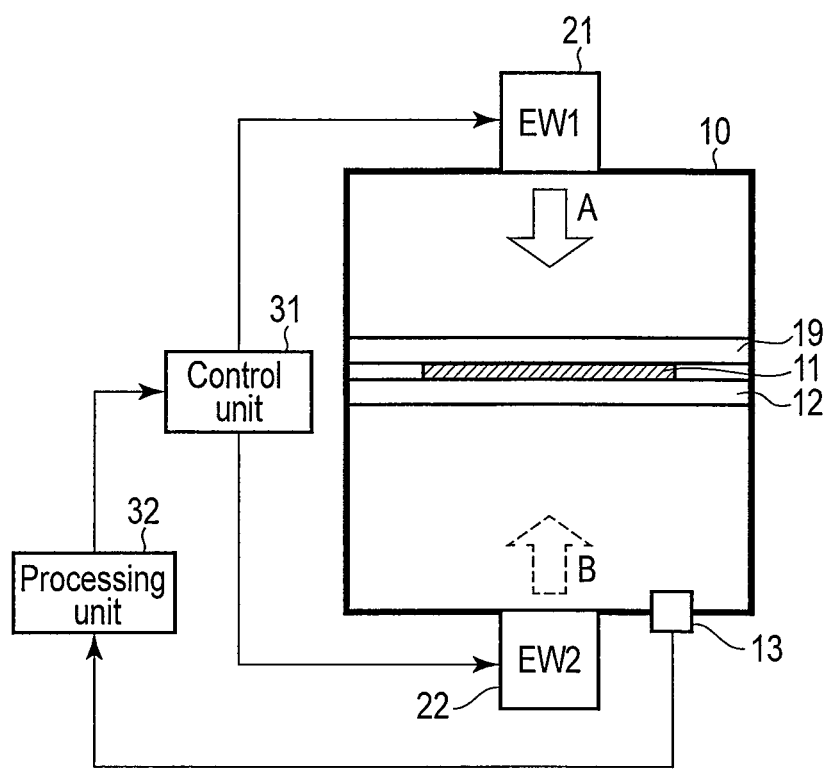
FIG. 8 is a schematic configuration diagram showing a microwave annealing apparatus according to a modification.

The additional susceptor 19 which is made of single-crystal silicon can be located on the top of the semiconductor substrate as shown in FIG. 8. This means that the semiconductor substrate is sandwiched with the two susceptors 12, 19 made by single-crystal silicon. In this case, the electromagnetic wave B can be absorbed by the two susceptors 12, 19. This leads to uniform temperature distribution of the semiconductor substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A microwave annealing apparatus comprising:
a housing configured to shield electromagnetic waves;
a first electromagnetic wave source configured to apply a first electromagnetic wave in a microwave region into the housing;
a second electromagnetic wave source configured to apply, into the housing, a second electromagnetic wave having a higher frequency than the first electromagnetic wave;
a susceptor configured to hold a semiconductor substrate, made of a material transparent to the first electromagnetic wave and provided in the housing;
a temperature measuring device configured to measure the temperature of the semiconductor substrate; and
a control unit configured to control powers of each of the first electromagnetic wave source and the second electromagnetic wave source in accordance with the temperature measured by the temperature measuring device,
wherein the control unit keeps the second electromagnetic wave source turned on to heat the semiconductor substrate until the temperature reaches a preset temperature, and turns off the second electromagnetic wave source and turns on the first electromagnetic wave source when the temperature measured reaches the preset temperature to keep the temperature at a substantially same temperature as the preset temperature.

2. The apparatus of claim 1, wherein the susceptor is made of glass.

3. The apparatus of claim 1, wherein the susceptor is made of single-crystal silicon.

4. The apparatus of claim 1, wherein the first electromagnetic wave is a microwave having a frequency ranging from 1 GHz to 45 GHz, and the second electromagnetic wave is a terahertz wave having a frequency ranging from 3 THz to 17 THz.

5. The apparatus of claim 1, wherein the first electromagnetic wave is a microwave having a frequency ranging from 1 GHz to 45 GHz, and the second electromagnetic wave is light having a frequency of at least 300 THz.

6. The apparatus of claim 1, wherein the susceptor is secured to a rotation mechanism made of a material transparent to the first electromagnetic wave and is able to rotate.

7. The apparatus of claim 1, wherein the temperature measuring device is a radiation thermometer.

8. The apparatus of claim 1, wherein the first electromagnetic wave source is a magnetron.

9. The apparatus of claim 1, wherein the first electromagnetic wave source is provided on the upper surface of the housing, and the second electromagnetic wave source is provided on the lower surface of the housing.

* * * * *